United States Patent [19]

Arumugham et al.

[11] 4,245,186
[45] Jan. 13, 1981

[54] TUNING VOLTAGE INTERFACE CIRCUIT FOR ELECTRONIC TUNERS

[75] Inventors: Rangaswamy Arumugham, Acton, Mass.; George H. Kam, Tonawanda, N.Y.

[73] Assignee: GTE Products Corporation, Stamford, Conn.

[21] Appl. No.: 968,068

[22] Filed: Dec. 11, 1978

[51] Int. Cl.³ .................................. G05F 3/20
[52] U.S. Cl. ...................... 323/225; 307/DIG. 1; 354/15
[58] Field of Search ............... 363/158; 323/19, 22 Z; 334/15; 331/177 V; 307/320, 313, DIG. 1

[56] References Cited

U.S. PATENT DOCUMENTS

| | | | |
|---|---|---|---|
| 3,316,423 | 4/1967 | Hull | 307/313 |
| 3,771,053 | 11/1973 | Kaizawa | 307/313 |
| 3,787,784 | 1/1974 | Mangold et al. | 331/177 V |

Primary Examiner—William H. Beha, Jr.
Attorney, Agent, or Firm—John A. Odozynski

[57] ABSTRACT

A high input impedance, low output impedance, temperature-stable tuning voltage interface circuit with substantial ripple rejection and negligible DC offset. The circuit comprises two transistors of opposite conductivity types, the first being coupled through a resistor to a supply voltage and through a temperature-stabilizing, DC-offsetting diode to the output of the second transistor. The rejection of the ripple voltage superimposed on the supply voltage is determined by the ratio of the value of the resistor to the effective resistance of the diode.

3 Claims, 1 Drawing Figure

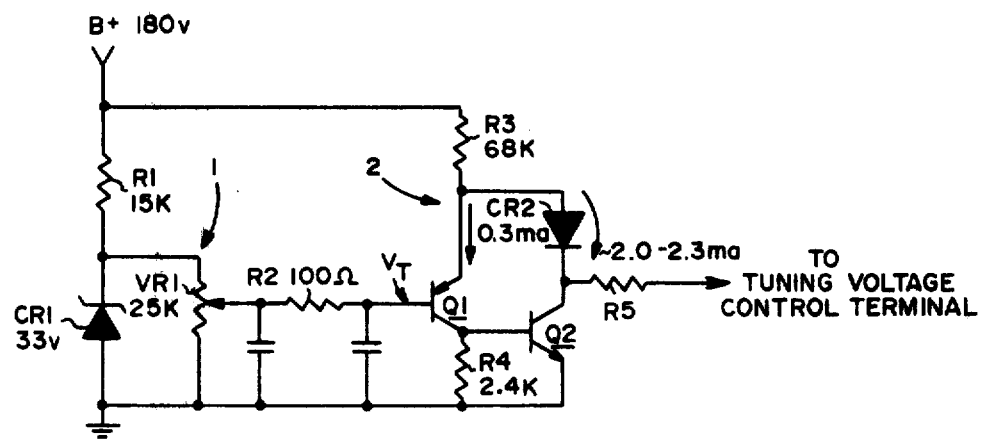

TUNING VOLTAGE INTERFACE CIRCUIT FOR ELECTRONIC TUNERS

FIELD OF THE INVENTION

This invention relates to voltage-controlled tuning systems in general and more particularly to a circuit for interfacing a source of variable tuning voltage to the voltage-controlled circuitry.

BACKGROUND OF THE INVENTION

Voltage-controlled, e.g., varactor, tuners require a variable tuning voltage to be applied at a tuning control terminal in order to establish the tuner's frequency of operation. The source of tuning voltage typically comprises some sort of regulated voltage across which is connected a potentiometer. The wiper of the potentiometer is coupled to an input of a tuning voltage interface circuit and therefrom to the tuner's tuning control terminal.

In a television receiver, for example, a single varactor diode may be used to cover both Low and High Band VHF channels corresponding to local oscillator frequency ranges of 101 to 129 MHz and 221 to 257 MHz respectively. Similarly, a single varactor diode may be used to cover the UHF Band corresponding to local oscillator frequencies from 517 to 931 MHz. As a result, it is essential that the tuning voltage applied to the tuner be accurate and (temperature) stable. For instance, it has been found that the tuning voltage sensitivity, that is, the degree of change in the tuner's local oscillator frequency resulting from a given change in tuning voltage, can be 2.5 MHz/volt on Low Band VHF channel 2, 5.4 MHz/volt on High Band VHF channel 7, and 30 MHz/volt on UHF channel 40.

Although conventional receivers have AFC circuitry tending to correct for frequency errors by combining an error correction voltage with the tuning control voltage, such AFC systems are typically characterized by a hold-in range of on the order of ±1 MHz. That is, once the frequency of the converted IF picture carrier falls out-side the limits of approximately 44.75 to 46.75 MHz, the effectiveness of the AFC system will be largely reduced. As an illustration, given a 30 MHz/volt tuning voltage sensitivity on channel 40 and a 1 MHz hold-in range, 33 millivolts is the maximum tolerable drift in tuning voltage before AFC lockout occurs. Furthermore, even within the AFC hold-in range, the finite loop gain of the AFC system suggests that, in order to maintain the converted carrier signals as closely as possible to their nominal values, the tuning voltage be held as accurate and stable as possible.

In order to minimize the drift of tuning voltage with temperature, it is expedient to develop temperature-stable source of tuning voltage. In conventional systems a temperature-compensated zener diode, having a breakdown voltage greater than the maximum required tuning voltage, is connected in parallel with a tuning potentiometer. Because temperature compensation of the zener diode requires a substantially constant zener current, it is necessary that the potentiometer resistance, as well as the input resistance of the interface circuit, be maintained at a constant value, regardless of tuning voltage or ambient temperature. In addition, in AFC systems as described in U.S. Pat. No. 3,952,143, "Wide Band AFC System" by K. Siwko, which use the tuning voltage as a supply for the AFC error amplifier, it is required that the output impedance at the tuning voltage source, that is, at the output of the interface circuit, be very low and substantially constant over the entire range of tuning voltage.

Analogously, because of the tuning voltage sensitivity of varactor tuners, it is necessary that the tuning voltage, in addition to being free from temperature drift, also be free from any superimposed AC ripple voltage. The ripple voltage will result in modulation of the local oscillator frequency at the ripple frequency. Peak-to-peak ripple voltages on the order of millivolts may be objectionable on channels having a relatively high tuning voltage sensitivity.

Furthermore, because it may be necessary that the tuning voltage be variable over the entire range provided by the source of tuning voltage, in order to tune the local oscillator over the desired range of frequencies, it is desirable that there be minimal offset between the source of tuning voltage and the voltage applied to the tuning control terminal.

OBJECTS OF THE INVENTION

Accordingly, it is an object of this invention to provide a high input impedance, low output impedance tuning voltage interface circuit.

It is a further object that the circuit be temperature-stable and exhibit negligible input-to-output DC offset.

It is a further object of this invention that the circuit effectively prevent the B+ ripple voltage from being superimposed on the tuning control voltage.

SUMMARY OF THE INVENTION

The above and other objects and advantages are achieved in one aspect of this invention by a tuning voltage interface circuit comprising a first semiconductor device having a first terminal coupled to a source of tuning voltage and a second terminal coupled through a first resistance to a supply voltage. A second device has a first terminal coupled to a third terminal of the first device, a second terminal coupled to a reference potential, and a third terminal coupled through a second resistance to the first resistance and to the second terminal of the first semiconductor device.

BRIEF DESCRIPTION OF THE DRAWING

The sole drawing is a schematic diagram of the subject invention.

DESCRIPTION OF PREFERRED EMBODIMENT

Referring now to the drawing, a source of tuning voltage 1 comprises a 33-volt zener diode, CR 1, having an anode connected to ground and a cathode coupled through a resistor, R1, to a 180-volt supply, B+. A tuning potentiometer, VR1, is connected in parallel with CR1 and has a wiper coupled through a resistor, R2, to the input of the subject interface circuit 2, at the base of a PNP transistor, Q1. CR1 is a temperature-compensated diode and the current flowing through it is designed to provide the desired voltage-temperature coefficient. Because the DC input impedance at the base of Q1 is very high and, as described below, substantially independent of the tuning voltage, $V_T$, it can be disregarded and, the nominal values of the currents flowing through R1 and VR1 are 9.8 ma and 1.3 ma respectively, so that the zener current is approximately 8.5 ma. A 33-volt zener diode accommodates the 2 to 28 tuning voltage range required by the voltage-controlled tuner.

It is clear that other values of zener voltage would be appropriate in other voltage-controlled systems.

The interface circuit 2 comprises a PNP transistor Q1, having an input terminal, or base, at which is applied a tuning voltage, $V_T$, that varies from approximately 2 to 28 volts depending on the wiper position of VR1. Q1 has an emitter terminal coupled through a first resistance, resistor R3, to B+ and an output terminal, or collector, connected to the input terminal, or base, of an NPN transistor Q2. The collector of Q1 and base of Q2 are coupled through a 2.4 K ohm resistor, R4, to ground. The output terminal, or collector, of Q2 is coupled through a second resistance, in the form of a diode CR2, to the emitter of Q1 and through R3 to B+. The collector of Q2 is also coupled through a resistor, R5, to the tuning voltage control terminal of a voltage-controlled tuner. R5 may be on the order of 1.5 K ohms and the input impedance at the tuning control terminal is many times greater so that the voltage drop across R5 is insignificant and the voltage at the tuning control terminal will be substantially equal to the voltage at the base of Q1, $V_T$, plus the base-to-emitter drop, $V_{BE}$, across the base-emitter junction of Q1, minus the voltage drop across CR2. Because $V_{BE}$ is offset by the drop across CR2, the voltage at the collector of Q2 will be substantially equal to $V_T$. Furthermore, it is well-known that $V_{BE}$ can be expected to vary with temperature on the order of 2 MV/°C. This, temperature variance is also compensated for by the voltage drop across CR2.

Temperature stabilization of the tuning control voltage is also enhanced by maintaining constant current through CR1. However, the current through CR1 will vary somewhat as the input impedance of the interface circuit, that is, the impedance at the base of Q1, varies. In order to assure a constant input impedance at Q1, it is necessary that emitter current of Q1 remain substantially constant as VT varies from 2 to 28 volts. This is accomplished in the following manner.

Given a value of B+ equal to 180 volts, the voltage across R3 will vary from approximately 177.3 to 151.3 volts as $V_T$ varies from 2 to 28 volts. The current through R3 will vary from 2.60 ma to 2.23 ma accordingly. The voltage across R4, however, will be clamped at 0.7 volts due to the base-to-emitter drop of Q2, so that the current through it will be held at approximately 0.3 ma. Because the current gains of both Q1 and Q2 are relatively high, the nominal collector and emitter current of Q1 will be approximately 0.3 ma and the collector current of Q2, as well as the current through CR2, will vary by approximately 2.3 to 1.93 ma as $V_T$ varies from 2 to 28 volts. Q1 and Q2 are arranged in a feedback configuration so that any tendency toward a change in the collector current of Q1 will result in a change, in the same direction, in the base current input to Q2 and a change in the current through it. Because Q1 and Q2 must share the total current flowing through R3, the feedback configuration assures that the collector and emitter currents of Q1 will be held substantially constant as $V_T$ is varied. In addition, because the value of B+ is substantially (approximately six times) greater than the maximum tuning voltage, the current through R3 and, more importantly, the current through CR2 and Q2 remain relatively constant with VT. For example, the current through CR2, at its maximum and minimum values, is within 10 percent of the geometric mean of those values.

In order to further improve the operation of a system having tuning voltage sensitivities as indicated above, it is desirable that the voltage applied to the tuning control terminal be free of any ripple voltage that may be super-imposed on the 180-volt B+. Depending on the manner in which the 180-volt supply is developed, as much as 2 volts peak-to-peak ripple may be encountered. Although it is possible to some extent to filter the ripple voltage, it may be difficult to provide the desired by-pass for all frequencies in this manner. The feedback configuration comprised by this invention exhibits inherent ripple-rejection characteristics. An analysis of this circuit shows that the ripple rejection it affords is approximately equal to the resistance value of R3 divided by the dynamic resistance of CR2. As is well known, the dynamic resistance of a semiconductor diode is inversely related to the current flowing through it. For the operating currents indicated above, the dynamic resistance of CR2 can be taken at all times to be no greater than 25 ohms. As a result, the ripple rejection afforded is equal to 68 K ohms/25 ohms, or approximately 68.7 db. In general, if the ratio of the dynamic resistance of CR1 to the resistance of R3 is designated as X, then the ripple rejection will be approximately equal to $[20 \log_{10} 1/x]$ db. To illustrate, 2 volts peak-to-peak ripple voltage on the 180-volt B+ will be so attenuated as to produce only 0.74 mv ripple at the collector of Q2. This degree of ripple rejection has been found to be maintained for frequencies between 30 Hz and 30 MHz.

To summarize, the tuning voltage interface circuit described herein exhibits the following salutory properties:

(1) a high input impedance that remains substantially constant with tuning voltage;
(2) an output impedance significantly lower than the impedance at the tuning control terminal;
(3) negligible input-to-output DC offset;
(4) temperature stabilization; and
(5) substantial ripple rejection.

Accordingly, while there has been shown and described what are at present considered the preferred embodiments of the invention, it will be obvious to those skilled in the art that various changes and modifications may be made therein without departing from the scope of the invention as defined by the appended claims.

What is claimed is:

1. A tuning voltage interface circuit comprising:
   a first transistor of one conductivity type having a base coupled to a source of tuning voltage, an emitter coupled through a first resistor to a source of supply voltage, and a collector coupled through a second resistor to a reference potential;
   a second transistor of another conductivity type having a base coupled to the collector of the first transistor, an emitter coupled to the reference potential, and a collector coupled through a diode to the resistor and to the emitter of the first transistor, so that the voltage drop across the base-to-emitter junction of the first transistor and the voltage drop across the diode track with temperature; and
   means for coupling collector of the second transistor to a tuning voltage control terminal.

2. An interface circuit as defined in claim 1 wherein the first transistor is a PNP type and the diode has an anode connected to the emitter of the first transistor and a cathode connected to the collector of the second transistor and coupled to the tuning control terminal so that the base-to-emitter voltage of the first transistor and the voltage drop across the diode offset each other so that the voltage applied to the tuning control terminal is substantially equal to the voltage provided by the source of tuning voltage.

3. An interface circuit as defined in claim 2 wherein the ratio of the value of the first resistor to the dynamic resistance of the diode is approximately 68.7 db.

* * * * *